United States Patent
Wang et al.

(10) Patent No.: US 10,666,018 B2
(45) Date of Patent: May 26, 2020

(54) QUANTUM CASCADE LASER ELEMENT

(71) Applicant: RIKEN, Wako-shi, Saitama (JP)

(72) Inventors: Li Wang, Wako (JP); Tsung-Tse Lin, Wako (JP); Ke Wang, Wako (JP); Hideki Hirayama, Wako (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 16/288,707

(22) Filed: Feb. 28, 2019

(65) Prior Publication Data

US 2019/0273363 A1 Sep. 5, 2019

(30) Foreign Application Priority Data

Mar. 1, 2018 (JP) ................. 2018-037012

(51) Int. Cl.
- *H01S 5/34* (2006.01)
- *H01S 5/06* (2006.01)
- *H01S 5/0683* (2006.01)
- *H01S 5/343* (2006.01)

(52) U.S. Cl.
CPC .......... *H01S 5/3402* (2013.01); *H01S 5/0612* (2013.01); *H01S 5/06837* (2013.01); *H01S 5/3407* (2013.01); *H01S 5/34313* (2013.01); *H01S 5/34353* (2013.01); H01S 5/3415 (2013.01); *H01S 5/3425* (2013.01); H01S 2302/02 (2013.01)

(58) Field of Classification Search
CPC ... H01S 5/34; H01S 5/343; H01S 5/00; H01S 3/20; H01S 5/0683
USPC .................................................... 372/45.012
See application file for complete search history.

(56) References Cited

U.S. PATENT DOCUMENTS

| 8,699,535 B1 | 4/2014 | Freeman |
| 9,001,858 B1 * | 4/2015 | Hirayama ............. H01S 5/3425 372/45.012 |

(Continued)

OTHER PUBLICATIONS

Harrison, "Engineering the electron—phono scattering rates in the active regions of quantum cascade lasers operating beyond 30μm," *Semicond. Sci. Technol.* 12:1487-1490, 1997. (5 pages).

(Continued)

*Primary Examiner* — Tuan N Nguyen
(74) *Attorney, Agent, or Firm* — Seed IP Law Group LLP

(57) ABSTRACT

To increase the maximum operating temperature of quantum cascade lasers of a terahertz region, a quantum cascade laser element 1000 according to the present invention has a semiconductor superlattice structure sandwiched between a pair of electrodes, the semiconductor superlattice structure has an active region 100 that emits electromagnetic waves of a frequency in a THz region under an external voltage applied through the pair of electrodes for operation, and the active region 100 has plural unit structures 10U, each of which is repeatedly layered over one another. Each of the unit structures 10U has a double quantum well structure formed of a first well layer 10W1 and a second well layer 10W2 separated from each other by a barrier layer, the first well layer 10W1 and the second well layer 10W2 have compositions different from each other, and when the external voltage is not being applied, potential energy for electrons in the second well layer 10W2 is lower than that in the first well layer 10W1.

7 Claims, 14 Drawing Sheets

(56) References Cited

U.S. PATENT DOCUMENTS

| | | | | |
|---|---|---|---|---|
| 2010/0026400 | A1* | 2/2010 | Koyama | H01L 29/882 |
| | | | | 331/107 T |
| 2017/0201072 | A1* | 7/2017 | Kotani | H01S 5/32025 |
| 2017/0338627 | A1* | 11/2017 | Kotani | H01S 5/3421 |

OTHER PUBLICATIONS

Kumar et al., "Two-well terahertz quantum-cascade laser with direct intrawell-phonon depopulation," *Applied Physics Letters* 95:141110, 2009. (3 pages).

Lin et al., "Design for Stable Lasing of an Indirect Injection THz Quantum Cascade Laser Operating at Less Than 2 THz," *International Journal of Materials Science and Applications* 6(5):230-234, 2017.

Fathololoumi et al., "Terahertz quantum cascade lasers operating up to ~ 200 K with optimized oscillator strength and improved injection tunneling," *Optics Express* 20(4):3866-3876, 2012.

Kumar, "Recent Progress on Terahertz Quantum-Cascade Lasers," *OSA/CLEO/QELS: 2010 Laser Science to Photonic Applications*, San Jose, CA, May 16-21, 2010, 2 pages.

Kumar, "Recent Progress in Terahertz Quantum Cascade Lasers," *IEEE Journal of Selected Topics in Quantum Electronics* 17(1):38-47, 2011.

\* cited by examiner

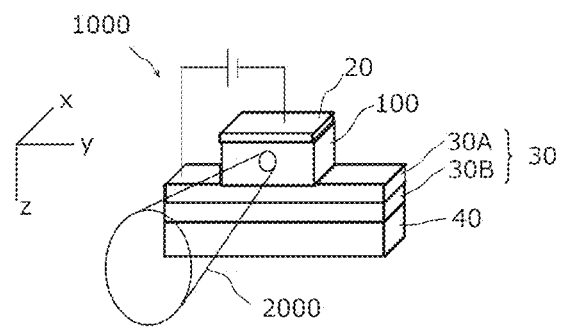
FIG. 1A
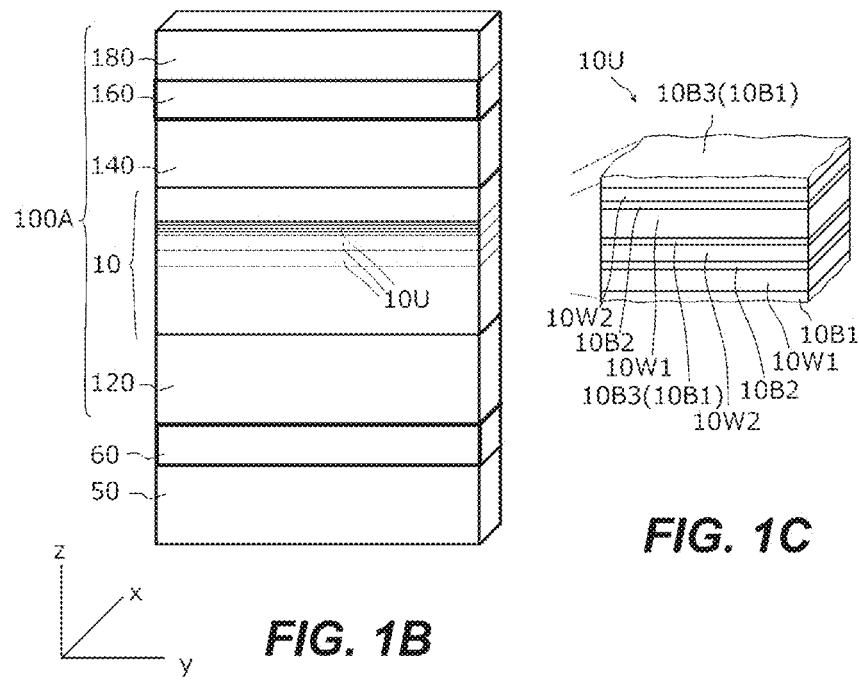
FIG. 1B
FIG. 1C

QUANTUM CASCADE LASER ELEMENT

BACKGROUND

Technical Field

The present invention relates to a quantum cascade laser element. More specifically, the present invention relates to a quantum cascade laser element that emits electromagnetic waves in a terahertz region.

Background Art

Quantum cascade lasers, hereinafter referred as "QCLs," have recently gained attention as solid state light sources that release or emit electromagnetic waves in a mid-infrared region or a terahertz (THz) region. A QCL element includes a semiconductor superlattice structure including repeated unit structures, and the potential acting on electrons inside the semiconductor superlattice structure generally has plural wells and plural barriers in each of these unit structures. When external voltage is applied to the QCL element for operation thereof, the potential in the wells and barriers of the semiconductor superlattice structure has a rising and falling pattern that is generally inclined along the thickness direction. The electrons serving as carriers repeat intersubband transition while being transported through subbands, that is, levels, formed in the potential that is inclined and having the rising and falling pattern, and enable lasing by stimulated emission of electromagnetic waves. The term, "cascade," has been given in connection with the behavior of the electrons transported while undergoing intersubband transition and losing energy. Lasing by a QCL element at a selected wavelength unrelated to the energy gap of the material forming the semiconductor superlattice structure is possible. The lasing wavelength is able to be modified by changing the design of the semiconductor superlattice structure. Therefore, QCL elements have gained attention as coherent light sources in a mid-infrared region or a terahertz (THz) region, which are wavelength regions (frequency ranges) never achieved by solid state light sources that have been available.

THz waves that are electromagnetic waves in a THz region have characteristics of both light and electric waves, and for example, the THz waves are expected to be applied to identification of substances and fluoroscopic examination of human bodies by transmission. A THz-wave QCL (THz-QCL) element enabling stimulated emission at a target frequency as aimed has been regarded promising for increase in practicability of such applications. THz-QCL elements require band engineering for actually fabricating semiconductor superlattice structures having precisely designed well layer thicknesses and barrier layer thicknesses in consideration of gradient due to the electric field and the physical mechanisms.

In particular, the upper limit of the temperature range (hereinafter, referred to as the "maximum operating temperature") where lasing is realized serves as an index of practicability of THz-QCLs. The world's highest upper operation temperature of THz-QCL elements has been achieved by an element having a triple quantum well (QVV) structure with three quantum wells, but is just 199.5 K (−73.65° C.) at best (Non-Patent Document 1). The element having the triple quantum well structure has realized population inversion by a combination of: resonant tunneling injection operation; and electron extraction operation utilizing LO-phonon scattering. However, a THz-QCL element, which is for lasing operation at a temperature in a range reached by Peltier electronic cooling, 230 K or about −43° C., or higher, let alone room temperature, for example, 300 K or about 27° C., has not been realized.

CITATION LIST

Non-Patent Documents

Non-Patent Document 1: S. Fathololoumi, et al., "Terahertz quantum cascade lasers operating up to 200 K with optimized oscillator strength and improved injection tunneling," Optics Express Vol. 20, Issue 4, pp. 3866 to 3876 (2012), doi:10.1364/OE.20.003866

Non-Patent Document 2: Sushil Kumar, "Recent Progress in Terahertz Quantum Cascade Lasers," OSA Technical Digest (CD) (Optical Society of America, 2010), Paper CWF1, https://doi.org/10.1364/CLEO.2010.CWF1

BRIEF SUMMARY

Technical Problem

The present inventors have investigated factors determining the maximum operating temperature; by analyzing in detail the operation of THz-QCL elements having the above described structure realizing the world's highest maximum operating temperature achieved thus far, based on a theoretical calculation method called the non-equilibrium Green's function (NEGF) method that produces highly reliable prediction results for conduction phenomena. As a result, the inventors have found out that the following two factors relate to the upper limit of the operation temperature.

(1) Population inversion is hindered due to stagnation of electrons at the injection level.

(2) Plural levels higher in energy than the upper lasing level and downstream therefrom on the flow of electrons have comparatively high probabilities of existence, and electrons easily leak from the upper lasing level to these plural levels.

The present invention solves at least one of the problems described above. The present invention contributes to development of various uses adopting THz-QCLs by increasing the maximum operating temperature realized by lasing in a quantum cascade laser element that operates in a THz region.

Solution to Problem

The present inventors have: variously examined specific QCL elements that could solve the above described problems through the NEGF method; found out that the above described factors are able to be eliminated or mitigated and the maximum operating temperature is thus able to be increased, by adopting a semiconductor superlattice having a structure that has two quantum wells in a unit structure thereof (a double quantum well structure) and that has been intentionally degraded in symmetry of the materials in the two quantum wells, that is, in symmetry of the potential structure; and completed the invention according to this patent application.

That is, provided according to an embodiment of the present invention is a quantum cascade laser element having a semiconductor superlattice structure sandwiched between a pair of electrodes, the semiconductor superlattice structure having an active region that emits electromagnetic waves of a frequency in a THz region under an external voltage applied through the pair of electrodes for operation of the quantum cascade laser element, the active region having plural unit structures repeatedly layered over one another, each of the plural unit structures having a double quantum well structure formed of a first well layer and a second well layer separated from each other by a barrier layer, the first well layer and the second well layer having compositions different from each other, potential energy for electrons in the second well layer being lower than that in the first well layer when the external voltage is not being applied.

According to the above described embodiment of the present invention, a thickness of the second well layer has been reduced preferably, such that under the external voltage, there is, at most, one thickness direction confinement level having a maximum value of probability of existence in the second well layer and having an energy value lower than potentials of two barrier layers sandwiching the second well layer.

According to this patent application, electromagnetic waves in a THz region refer to electromagnetic waves in a frequency range of about 0.1 THz to 30 THz, that is, a wavelength range of about 10 µm to 3 mm. Furthermore, a low frequency THz region refers to a frequency range equal to or less than 2.0 THz of the above defined THz region. Moreover, in the description of the present patent application, device structures and functions may be described by use of technical terms converted or borrowed from the fields of electronic devices and physics targeting visible light and infrared rays. Therefore, terms, such as "lasers" referring to quantum cascade laser elements, "emission" referring the phenomenon of stimulated emission, and prefixes, such as "optical-" and "photo-," may be used even in description related to electromagnetic waves of a frequency range or a wavelength range far from that of visible light.

Advantageous Effects of Disclosure

A quantum cascade laser element provided according to any one of modes of the present invention realizes lasing operation at an operation temperature higher than conventional ones.

BRIEF DESCRIPTION OF THE SEVERAL VIEWS OF THE DRAWINGS

FIG. 1A is a perspective view illustrating a general configuration of a THz-QCL element according to an embodiment of the present invention.

FIG. 1B is an enlarged sectional view illustrating a general configuration of a THz-QCL element according to an embodiment of the present invention.

FIG. 1C is, a further enlarged partial sectional view illustrating a general configuration of a THz-QCL element according to an embodiment of the present invention.

FIGS. 4A and 4B provide explanatory diagrams illustrating the conception of the asymmetric 2QW structure according to the embodiment of the present invention having different values of conduction band potential in a well layer, in which FIG. 4A shows a case where there is no bias electric field and FIG. 4B shows when there is a bias electric field.

FIG. 5B being that for the THz-QCL element according to the embodiment; and distribution diagrams illustrating distributions of current density, FIG. 5C being that for the THz-QCL element having the conventional RT 3QW structure, FIG. 5D being that for the THz-QCL element according to the embodiment.

DETAILED DESCRIPTION

Figure 2B:
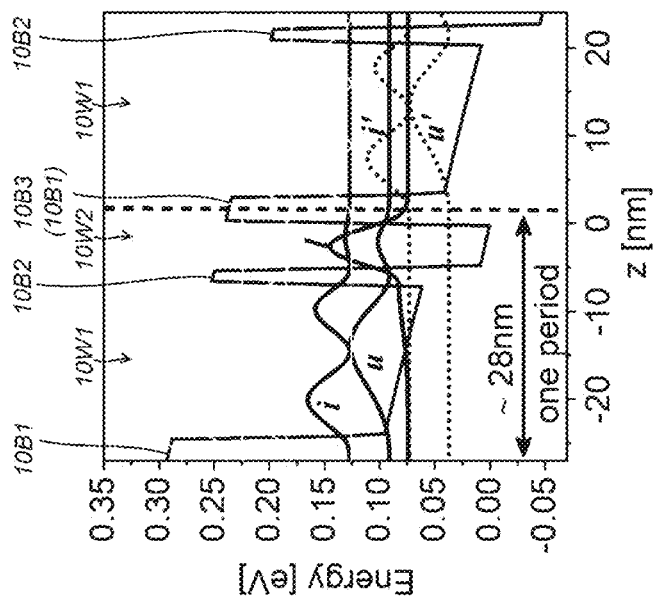
FIG. 2B is an explanatory diagram illustrating potential structures of conduction bands of THz-QCL elements and the probability of existence per subband (level) of electrons in relation showing an asymmetric 2QW structure according to the embodiment of the present invention.

Described hereinafter is a quantum cascade laser element according to the present invention. Throughout the description, unless otherwise particularly stated, any parts or elements that are the same will be assigned with the same reference sign. Furthermore, elements of each embodiment are not necessarily drawn to scale throughout the drawings.

1. First Embodiment

As a first embodiment of the present invention, a THz-QCL element for lasing operation at about 3 THz to 4 THz will be described in detail.

1-1. Configuration of THz-QCL Element According to First Embodiment

FIGS. 1A and 1B include a perspective view (FIG. 1A), an enlarged sectional view (FIG. 1B), and a more enlarged partial sectional view (FIG. 1C), all illustrating a general configuration of the THz-QCL element according to the first embodiment. A typical THz-QCL element 1000 (FIG. 1A) is generally formed of a pair of electrodes 20 and 30, and a QCL structure 100 that is a semiconductor superlattice structure sandwiched between the pair of electrodes 20 and 30. The electrodes 20 and 30 are used for reception, from the outside, of: voltage for formation of an electric field for the QCL structure 100; and current for release of electromagnetic waves, that is, emission of electromagnetic waves. Furthermore, the electrodes 20 and 30 are formed of metal; and when electromagnetic waves of the THz region act on the electrodes 20 and 30, surface plasmons are induced and the electrodes 20 and 30 also exert their optical confinement action due to their cavity structure. This structure is also called a double metal waveguide (DMW) structure. The QCL structure 100 includes an active region 10. The THz-QCL element 1000 operates by causing electrons to pass through repeated electron potential structures formed in the active region 10, in a thickness direction thereof, when the voltage is applied. Upon this passage, the THz-QCL element 1000 operates so as to release electromagnetic waves 2000 of the THz region while the electrons undergo transition between subbands, that is, between levels. The THz-QCL element 1000 in FIG. 1 is fabricated by forming a metal layer 30B of the electrode 30 on a receptor substrate 40 (hereinafter, referred to as the "receptor 40"), and bonding the metal layer 30B to a metal layer 30A formed on the QCL structure 100.

The active region 10 (FIG. 1B) has plural unit structures 10U each including plural well layers 10W and plural barrier layers 10B alternately layered over each other and each having a certain thickness, and the unit structures 10U are repeatedly layered over one another in the thickness direction. In the semiconductor superlattice structure 100A illustrated in FIG. 1B, the active region 10 is formed by repeatedly layering the same unit structure 10U, by 10 to 200 periods generally. FIG. 1C illustrates an enlarged structure of one unit (one period) of these unit structures 10U. Each unit structure 10U is formed of two well layers 10W and two barrier layers 10B, and the well layers 10W are separated from each other by the respective barrier layers 10B. The individual well layers 10W are distinguished from each other as a first well layer 10W1 and a second well layer 10W2 in order from a substrate 50 side. The individual barrier layers 10B are also distinguished from each other as required, and are called a first barrier layer 1061 and a second barrier layer 1062 in order from the substrate 50 side. The well layer 10W1 is arranged in contact with the barrier layer 1061, and the barrier layer 1062 is arranged in contact with the well layer 10W1, and so on. A barrier layer 1063 serves as a barrier layer 1061 of the next unit structure 10U.

1-2. Conception

With the configuration of the unit structures 10U in the THz-QCL element 1000 according to the embodiment, operation at a high temperature never achieved before is achieved by realizing, firstly, indirect pumping type operation, and secondly, sufficient ability to reduce leak channels of electrons. An example of a specific structure that allows these operation and characteristics to be realized will be described in detail, with its conception, the example being a GaAs/AlGaAs-based semiconductor superlattice structure. The description will be made while comparison is made between a conventional THz-QCL element having a resonant tunneling (RT) 3QW structure, and the THz-QCL element 1000 according to this embodiment. The RT type is the configuration that had been demonstrated to realize lasing at about 3.6 THz at the highest maximum operating temperature of 199.5 K (Non-Patent Document 1) prior to this patent application.

Figure 2A:
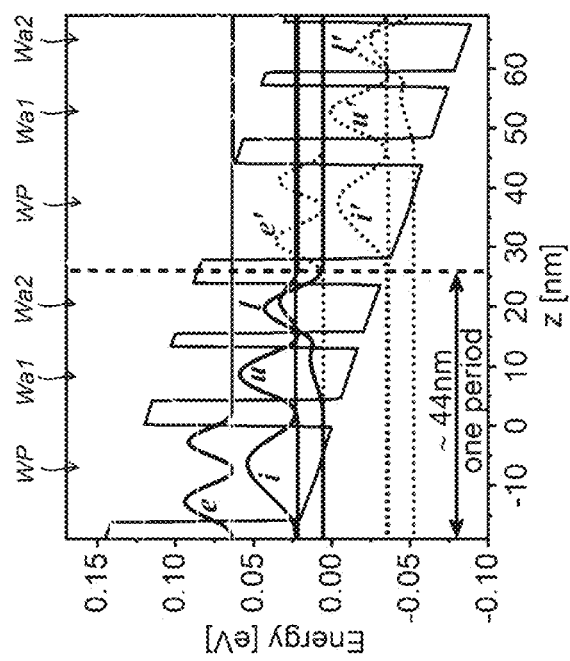
FIG. 2A illustrates a conventional RT 3QW structure.
Figure 3A:
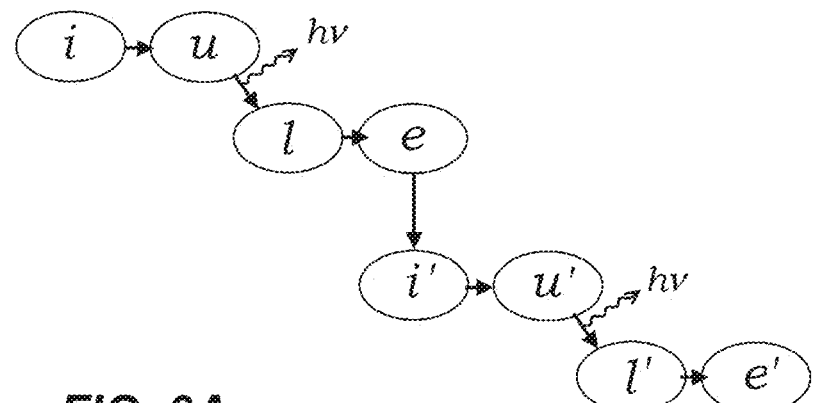
FIG. 3A, illustrates electrons transported illustrated by resonant tunneling (RT) injection.
Figure 3B:
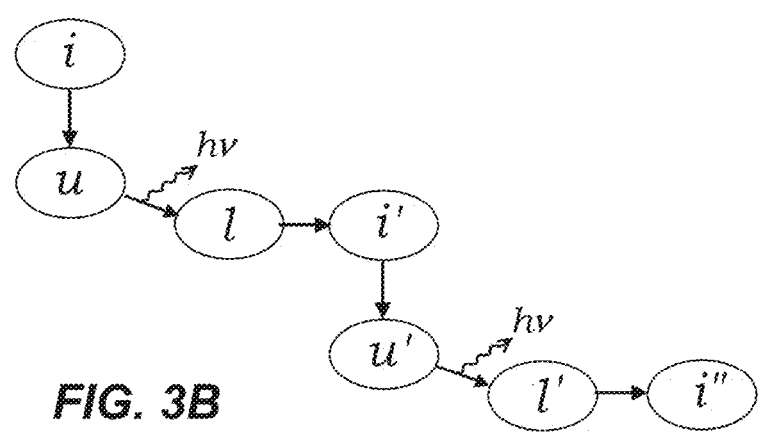
FIG. 3B illustrates electron transport involving transition by fabricating the structure illustrated in FIG. 2B. in relation to the embodiment of the present invention.

FIGS. 2A and 2B include an explanatory diagram illustrating potential structures of conduction bands and the probability of existence per subband (level) of electrons in the THz-QCL elements, FIG. 2A being those of the conventional RT 3QW structure, FIG. 2B being those of an asymmetric 2QW structure according to the embodiment. In each of these structures, the potential acting on electrons at each position along a z-direction (FIG. 1B) is the conduction band potential, and has a rising and falling form having relatively low values in the well layers and relatively high values in the barrier layers. When the external voltage for operation is applied to the pair of electrodes 20 and 30, a bias electric field is formed, the bias electric field causing the rising and falling form to be generally inclined. The raised parts and fallen parts of the potential of the THz-QCL element 1000 in FIG. 2B are assigned with the reference symbols corresponding to the respective layers of the unit structure 10U illustrated in FIG. 1C. FIGS. 3A and 3B are explanatory diagrams illustrating an ideal one of phenomena caused in transport through plural unit structures.

In the THz-QCL element having the RT 3QW structure realizing the highest operation temperature of 199.5 K illustrated in FIG. 2A, each well layer is GaAs, each barrier layer is AlGaAs, and the three wells are, from the upstream side (from the left side of FIG. 2A), a phonon well WP that is the widest, and two emission wells Wa1 and Wa2. The phonon well WP and the two emission wells Wa1 and Wa2 are made of the same material having a composition, such as, for example, GaAs, and thus has equal depths when no external voltage is applied.

Involved in lasing operation of the THz-QCL element having the conventional RT 3QW structure are four levels that are an injection level i, an extraction level e, an upper lasing level u, and a lower lasing level l. As illustrated in FIG. 2A, the injection level i and the extraction level e both have high probabilities of existence in the phonon well WP, and energy values of these levels are respectively low and high. The upper lasing level u and the lower lasing level l respectively have high probabilities of existence in the two emission wells Wa1 and Wa2. In the sequence of the operation where the electrons are transported, as illustrated in FIG. 3A, by resonant tunneling (RT) injection, electrons are injected to the upper lasing level u from the injection level i. Subsequently, by laser emission transition, energy is lost in association with stimulated emission from the upper lasing level u to the lower lasing level I. Furthermore, after shifting from the lower lasing level I to the extraction level e' by electron transport, the electrons undergo transition from the extraction level e' to the injection level i' by LO phonon scattering. The emission transition is diagonal transition where transition takes place such that the centroid of the probability of existence moves between the two emission wells Wa1 and Wa2. Moreover, the transition due to the LO phonon scattering from the extraction level e' to the injection level i occurs in the phonon well WP. The symbol, "'", indicates that the level is a level in the next unit structure positioned downstream. This operation is an ideal one not in consideration of leakage of electrons, and as illustrated in FIG. 3A, is operation among subbands (levels) repeated over plural unit structures.

As described above, the operation of the THz-QCL element having the conventional RT 3QW structure involves, so to speak, a technique that facilitates realization of population inversion between the upper lasing level u and the lower lasing level I by extraction of electrons through RT and LO phonon scattering via the extraction level e' and the injection level i, the electrons having undergone transition to the lower lasing level I after the stimulated emission. The maximum operating temperature of the THz-QCL element having the conventional RT 3QW structure is unable to be increased because: (1) the population inversion is hindered due to stagnation of electrons at the injection level i; and (2) plural levels higher in energy than the upper lasing level u and downstream therefrom on the flow of electrons have comparatively high probabilities of existence, and electrons easily leak from the upper lasing level u to these plural levels. Electrons that have leaked do not undergo the ideal state transition as illustrated in FIG. 3A, and thus hinder sustainment of the population inversion and reduces the efficiency of the optical gain.

FIG. 2B illustrates a potential structure adopted in the THz-QCL element 1000 according to the embodiment, and the inventors call this potential structure an asymmetric double quantum well structure (asymmetric 2QW structure). The THz-QCL element 1000 having this potential structure improves the above described first and second points (1) and (2).

According to the sequence of the transport operation of electrons in the THz-QCL element 1000, firstly, due to LO phonon scattering, electrons are injected to the upper lasing level u from the injection level i (indirect pumping). Subsequently, by laser emission transition, energy is lost in association with stimulated emission from the upper lasing level u to the lower lasing level I. Furthermore, electrons are extracted from the lower lasing level I to the injection level i by tunnel electron transport. Upon the indirect pumping in the THz-QCL element 1000, in the first well 10W1, the electrons are supplied to the upper lasing level u efficiently by the LO phonon scattering from the injection level i having higher energy than the upper lasing level u, and thus it is hard for electrons to stagnate at the injection level i. Such operation is illustrated as transition among states in FIG. 3B. In the transport of electrons in the unit structure 10U of the THz-QCL element 1000, the electrons are scattered at a high rate by LO phonons, and thus delay is hard to be caused in the injection of the electrons to the upper lasing level u (indirect pumping). Moreover, since the second well 10W2 is narrow and deep, a leak channel from the upper lasing level u is hardly formed, the leak channel being a level, which: has higher energy than the upper lasing level u; is generated at a position enabling easy transition from the upper lasing level u; and easily causes leakage.

Figure 4A:
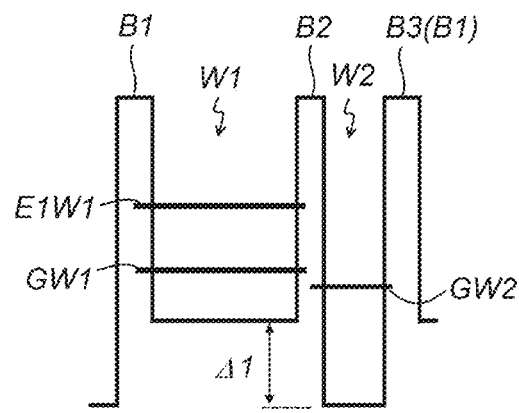
Figure 4B:
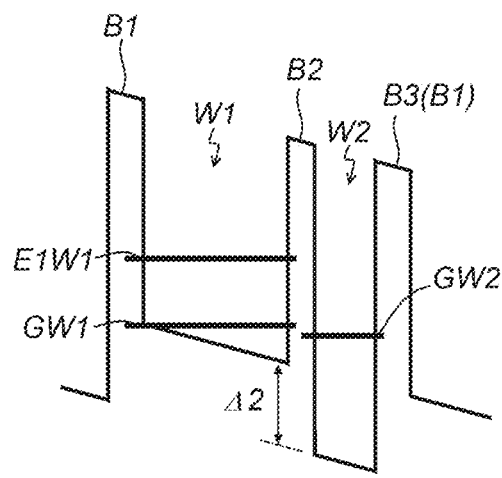

FIGS. 4A and 4B include explanatory diagrams illustrating conception of this asymmetric 2QW structure. When the bias electric field is omitted for simplification and the actual wave function is simplified for illustration of only ranges having high probabilities of existence by use of horizontal lines only, a ground state GW1 and a first excited state E1W1 are formed in the first well W1 corresponding to the first well 10W1. The energy difference from the first excited state E1W1 to the ground state GW1 is set to be suitable for transition due to LO phonons, by adjustment of the thickness of the first well W1 as appropriate. In the first well W2 corresponding to the second well 10W2, on the other hand, a ground state GW2 is formed, but no localized excited state higher than the ground state GW2 is formed. This is able to be realized easily by narrowing the thickness of the second well W2. This explanation without inclusion of the bias electric field is actually also applicable to a case where the whole structure is inclined in consideration of the bias electric field. This case is illustrated in FIG. 4B.

In the first well W1, the ground state GW1 is where the electrons are stored by the high speed extraction operation due to the LO phonons, and thus the level of this ground state GW1 is associated with the upper lasing level u in the emission. Furthermore, the ground state GW2, which is the only level localized in the second well W2, is associated with the lower lasing level I. In this case, if the first well layer W1 and the second well layer W2 are made of the same material, the energy at the ground state GW2 is higher than the energy at the ground state GW1. This is because the energy at a ground state is increased from the conduction band potential of a well by an energy value corresponding to zero point vibration in the well, and the ground state GW2 in the narrow second well thus has an increased energy value. The energy value at the ground state GW2 needs to be made lower than that of the ground state GW1 to make the transport of electrons unidirectional (in a direction heading rightward from the left side of the figure) and to match the energy values of the emission levels, but it is not practical to realize this configuration just by the bias electric field. Therefore, according to the embodiment, the bottom of the second well W2 is made deeper than that of the first well W1 by a value $\Delta 1$ (to be lower in the conduction band potential), and operation in an appropriate bias electric field is carried out. If the thickness of the second well W2 is decreased further as required correspondingly to this increase in depth, it is not difficult to just position one thickness direction confinement level at most in the second well W2. In the actual design, this is carried out when there is a bias electric field (FIG. 4B). Having different values of conduction band potential in a well layer in the case where there is no bias electric field (FIG. 4A) is reflected in the case where there is a bias electric field as an amount of shift $\Delta 2$ of potential in the well, and this amount of shift $\Delta 2$ is normally the same as the value $\Delta 1$. As to the barriers according to the embodiment, the values of the potential of the barrier layers are specifically described as being the same, but they are not necessarily the same. Furthermore, the thicknesses of the barrier layers are adjusted as appropriate for the purpose of adjusting the energy values of the levels.

In particular, positioning only one thickness direction confinement level at most in the second well W2 leads to no formation of an unnecessary level upper in the second well, and is thus significantly effective for reduction of leakage from the first well.

Other elements are made in the THz-QCL element 1000 as required for the operation. The QCL structure 100 illustrated in FIG. 1A is formed by trimming the external portion of the extent of the layered structure of the semiconductor superlattice structure 100A. The semiconductor superlattice structure 100A is typically formed by use of, for example, a GaAs substrate 50 (hereinafter, referred to as the "substrate 50") that has a (001) plane orientation and is semi-insulating (SI). In more detail, in this typical example, an etch stop layer 60 ("ES layer 60") is formed on a surface of the substrate 50, the etch stop layer 60 being, for example, a 250-nm-thick $Al_{0.6}Ga_{0.4}As$ layer. A highly doped n-type GaAs layer 120 typically having an electron density of about $3\times10^{18}$ cm$^{-3}$ is formed to be 800 nm in thickness and in contact with a surface of the ES layer 60, and thereafter, the active region 10 is formed thereon. A detailed configuration of the active region 10 will be described later. A highly doped n-type GaAs layer 140 typically having an electron density of about $3\times10^{18}$ cm$^{-3}$ is formed to be 100 nm in thickness, on the upper surface of the active region 10 that has been formed. Thereafter, a δ-doped GaAs layer 160 formed of ten sets are formed thereon, and lastly, a 5-nm-thick GaAs layer (LTG-GaAs layer) 180 grown at a low temperature is formed thereon, each of the ten sets including a 1-nm-thick GaAs layer and a δ-doped Si layer. FIG. 1B illustrates a configuration of films layered on one side of the substrate 50 upon film formation in the order that the films are sequentially layered from the bottom to the top of FIG. 1B. The semiconductor superlattice structure 100A illustrated in FIG. 1(b) has been flipped upside down relatively to the QCL structure 100 illustrated in FIG. 1(a).

Table 1 represents a typical design example of the THz-QCL element 1000 that operates at 3 THz to 4 THz, the design example including sizes of the layers, for more specific explanation.

TABLE 1

| Layer | Material | Thickness [nm] |
|---|---|---|
| First barrier layer 10B1 | $Al_{0.3}Ga_{0.7}As$ | 3.8 |
| First well layer 10W1 | $A_{0.05}Ga_{0.95}As$ | 17.2 |
| Second barrier layer 10B2 | $Al_{0.3}Ga_{0.7}As$ | 2.0 |
| Second well layer 10W2 | GaAs | 5.1 |
| Total for a unit structure corresponding to one period | — | 28.1 |

Furthermore, the first well layer 10W1 was designed to be doped at $3\times10$ cm$^{-2}$ 1-3. Carrier and Current Density Distributions Described below are results of simulation by the NEGF method for distributions of carrier (electron) density and current density with respect to position and energy, the distributions being realized in the above described conventional potential structure and potential structure according to the embodiment.

Figure 5A:
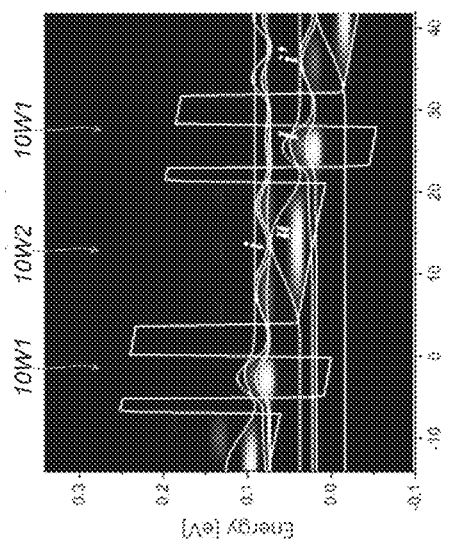
FIGS. 5A-5D are diagrams illustrating distributions of carrier density, FIG. 5A being that for the THz-QCL element having the conventional RT 3QW structure.
Figure 5B:
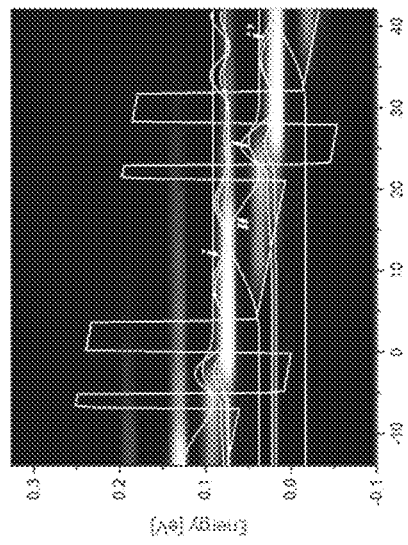

FIGS. 5A and 5B illustrate distributions of carrier density for the THz-QCL element having the conventional RT 3QW structure (FIG. 5A) and the THz-QCL element 1000 according to the embodiment (FIG. 5B), and distributions of current density for the THz-QCL element having the conventional RT 3QW structure (FIG. 5C) and the THz-QCL element 1000 according to the embodiment (FIG. 5D), respectively. Brighter positions in the distribution diagrams have larger values. These figures are overlaid with the potential structures and levels for understanding of the positions. As to calculation conditions used in obtaining these figures, the temperature was set to 200 K, and the external voltage, that is, the bias electric field was set to a value realizing lasing of 3.9 THz at 54 mV/period.

As to the ideal distributions of carrier density, electrons are preferably distributed only at the upper lasing level u for population inversion. As illustrated in FIG. 5A, in the conventional RT 3QW structure, the electron density is comparatively high at the injection level i present at a position low in energy in the phonon well WP, and stagnation is observed in the electron transport to the upper lasing level u. In contrast, as illustrated in FIG. 5B, in the THz-QCL element 1000, although the carrier density at the upper lasing level u is high in the first well 10W1, no stagnation of electrons is observed at the injection level i.

Figure 5C:
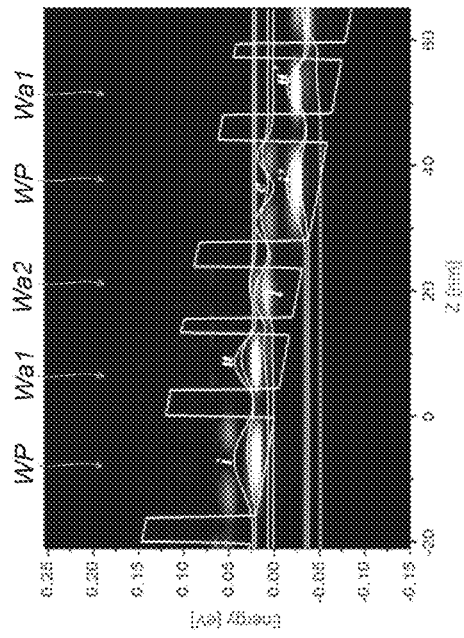
Figure 5D:
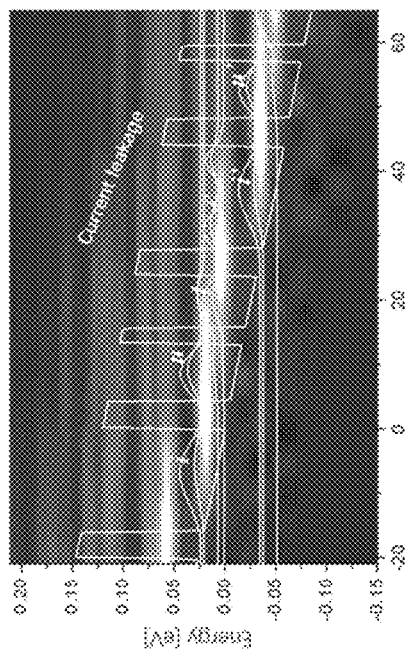

Furthermore, in the ideal distribution of current density, the value is preferably: high only at the position of the energy level where the injection or extraction operation is intentionally performed; and as low as possible at the other positions. Electrons at the upper lasing level u have the probability of being thermally excited to an arbitrary level higher in energy value than the upper lasing level u. If certain conditions are fulfilled, the level that receives these electrons after the thermal excitation may become a leak channel where the electrons leak further downstream from that level, the certain conditions being that the level has a possibility of becoming a continuum and that the level has a significant probability of existence at a position downstream (at the right side on the figure) from the position (the first well layer 10W1) where the probability of existence of the upper lasing level u is high. As illustrated in FIG. 5C, in the conventional RT 3QW structure, electrons at each level easily leak sideways. A level having the lowest energy of levels having the possibility of becoming leak channels is actually positioned 42 meV higher than the upper lasing level u. Moreover, leakage current flowing along a level having the possibility of becoming a leak channel is illustrated by being displayed brightly. That is, it has been confirmed by calculation that leakage occurs from the upper lasing level u in the conventional RT 3QW structure. In contrast, as illustrated in FIG. 5D, in the THz-QCL element 1000, the current density of leakage occurring at the position where electron is densely distributed in the upper lasing level u is small, and the current density due to the extraction to the injection level i from the lower lasing level I, which is a level contributing to emission, is high. Therefore, the population inversion is not easily affected by leakage. A level having the lowest energy of the levels serving as leak channels is actually positioned 90 meV higher than the upper lasing level u. This is a value twice the value (42 meV) for the conventional RT 3QW structure, and indicates that thermal excitation of electrons is hard to be caused according to the embodiment.

Figure 6A:
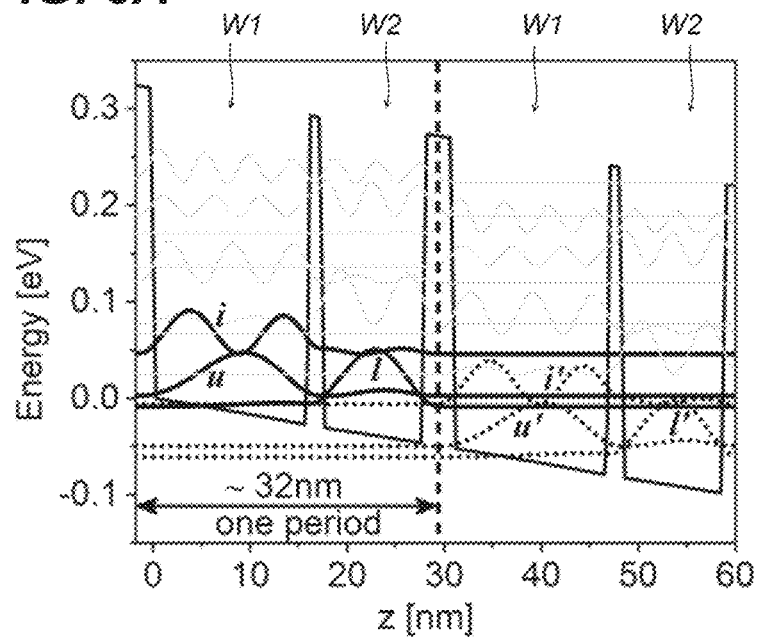
FIGS. 6A and 6B includes examples, in relation to the first embodiment of the present invention, of a potential structure as shown in FIG. 6A and a distribution of current density FIG. 6B, both calculated for a conventional 2QW structure.
Figure 6B:
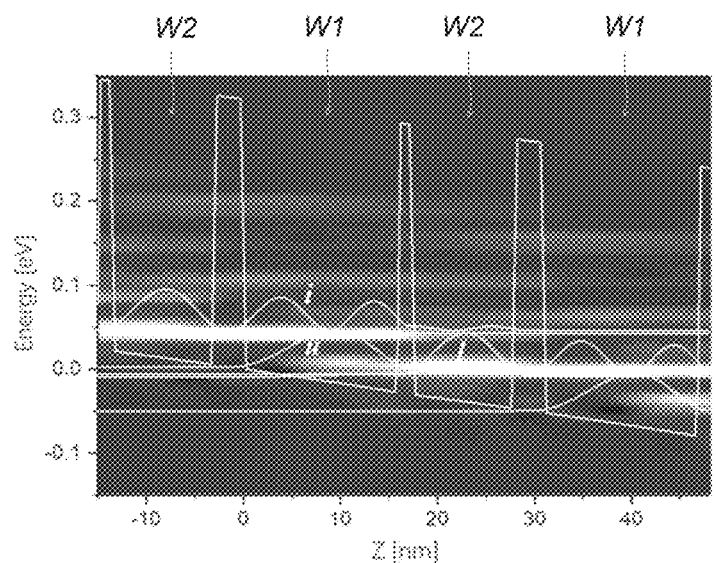

For comparison with the configuration according to the embodiment, similar calculation was carried out for a configuration where the wells are uniform in depth and a level having an energy value higher than the lower lasing level I is localized in the second well W2 where the maximum value of the probability of existence of the lower lasing level I is positioned. FIGS. 6A and 6B include examples of a potential structure (FIG. 6A) and a distribution of current density (FIG. 6B) both calculated for a conventional 2QW structure, and their coordinates along the z-axes have been aligned with each other by shift of FIG. 6A and FIG. 6B sideways. The example realizes electron transport without stagnation at the upper lasing level u by indirect pumping into the first well W1 similar to that according to the embodiment. However, in the second well W2, not only the lower lasing level I corresponding to the ground state, but also levels corresponding to the first excited state and second excited state have high probabilities of existence. As a result, the energy difference from the lower lasing level I to a level higher in energy value than the lower lasing level I is small in the second well W2, and many leak channels are formed and current flows therethrough. That is, even if indirect pumping in the first well W1 is used, unless the QCL structure 100 is formed such that the second well W2 becomes a narrow and deep well like in the THz-QCL element 1000 according to the embodiment, leakage is caused, and satisfactory population inversion is not necessarily able to be expected.

1-4. Operation Characteristics

Figure 7:
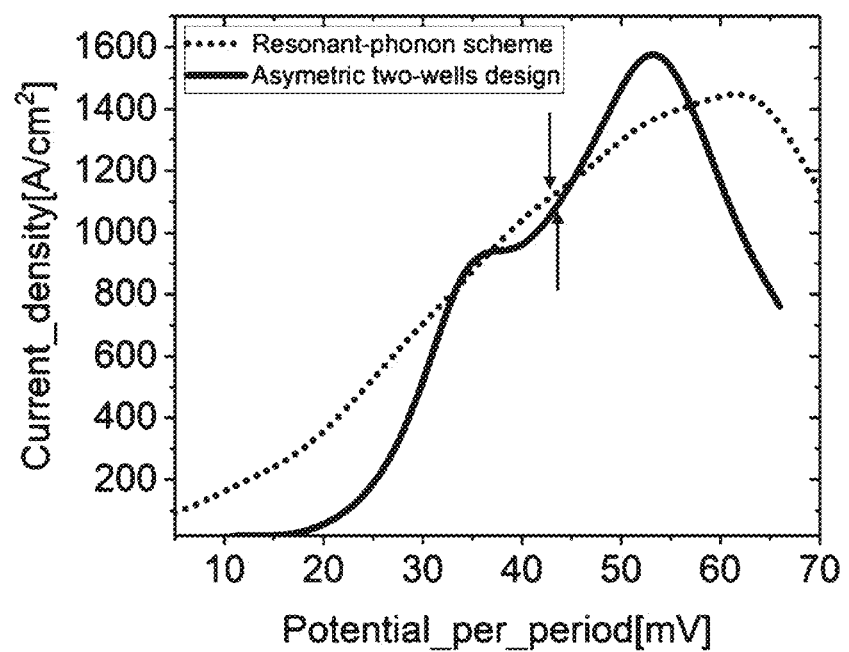
FIG. 7 is a graph illustrating, in relation to the first embodiment of the present invention, I-V characteristics of the THz-QCL element having the conventional RT 3QW structure and the THz-QCL element according to the embodiment, for comparison therebetween.
Figure 8:
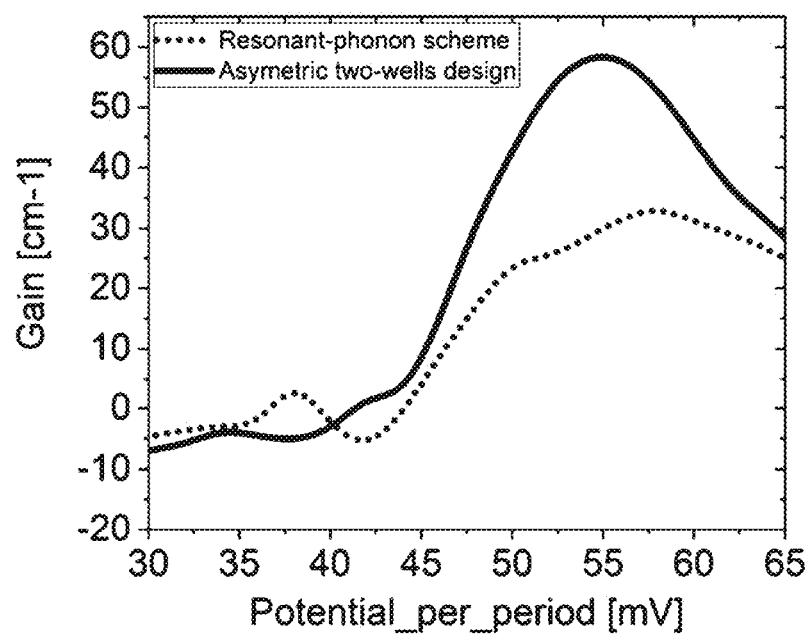
FIG. 8 is a graph illustrating, in relation to the first embodiment of the present invention, optical gain for the THz-QCL element having the conventional RT 3QW structure and the THz-QCL element according to the embodiment, for comparison therebetween.

FIG. 7 and FIG. 8 are graphs illustrating I-V characteristics and optical gain in the operation at 200 K of the THz-QCL element having the conventional RT 3QW structure and the THz-QCL element 1000 according to the embodiment, for comparison therebetween. In FIG. 7, the horizontal axis represents the potential difference per unit structure caused by the external voltage, that is, the value corresponding to the slope in FIG. 2B, and the vertical axis represents the current density. FIG. 8 illustrates the optical gain with respect to the horizontal axis representing the same value as that in FIG. 7 (but having a range different therefrom). In FIG. 7 and FIG. 8, the dotted lines with the legend, "Resonant-phonon scheme", are those of the THz-QCL element having the RT 3QW structure, and the solid lines are those of the THz-QCL element 1000 according to the embodiment having the asymmetric 2QW structure. When the optical gain in FIG. 8 exceeds 0, lasing operation is theoretically possible, and thus the values along the horizontal axis at positions on the graphs at 0 along the vertical axis are the lasing thresholds. From FIG. 8, lasing by the THz-QCL element having the conventional RT 3QW structure and the THz-QCL element 1000 according to the embodiment is enabled when the potential difference per unit structure becomes higher than 143 mV and 44 mV respectively. In FIG. 7, these lasing thresholds are indicated by arrows. Furthermore, it should be noted that in the THz-QCL element 1000 according to the embodiment, although the number of wells per unit structure is as small as two, no negative resistance is generated at the lasing threshold. Therefore, even if the external voltage is increased from 0 and reaches the lasing threshold, lasing operation by a configuration including a plurality of the unit structures 10U is not destabilized. From the graphs in FIG. 7 and FIG. 8, significant improvements in the performance are predicted, the significant improvements including that: a peak gain of 59 cm$^{-1}$ is achieved by the THz-QCL element 1000 according to the embodiment, the peak gain being 1.9 times the peak gain, 30.8 cm$^{-1}$, conventionally achieved; and a dynamic range of current density of lasing of 532 A/cm$^2$ from 1050 A/cm$^2$ to 1582 A/cm$^2$ is achieved by the THz-QCL element 1000 according to the embodiment, the dynamic range being 1.52 times the range, 350 A/cm$^2$ from 1040 A/cm$^2$ to 1390 A/cm$^2$, conventionally achieved.

Figure 9:
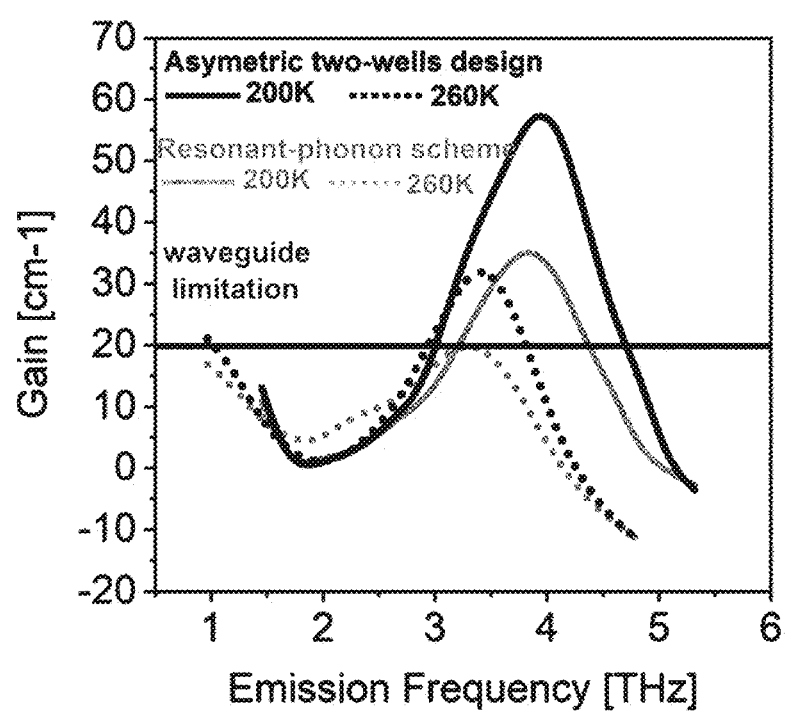
FIG. 9 is a graph obtained by calculation of optical gain spectra at 200 K and 260 K for the THz-QCL element having the conventional RT 3QW structure and the THz-QCL element adopting the asymmetric 2QW structure, in relation to the first embodiment of the present invention.
Figure 10:
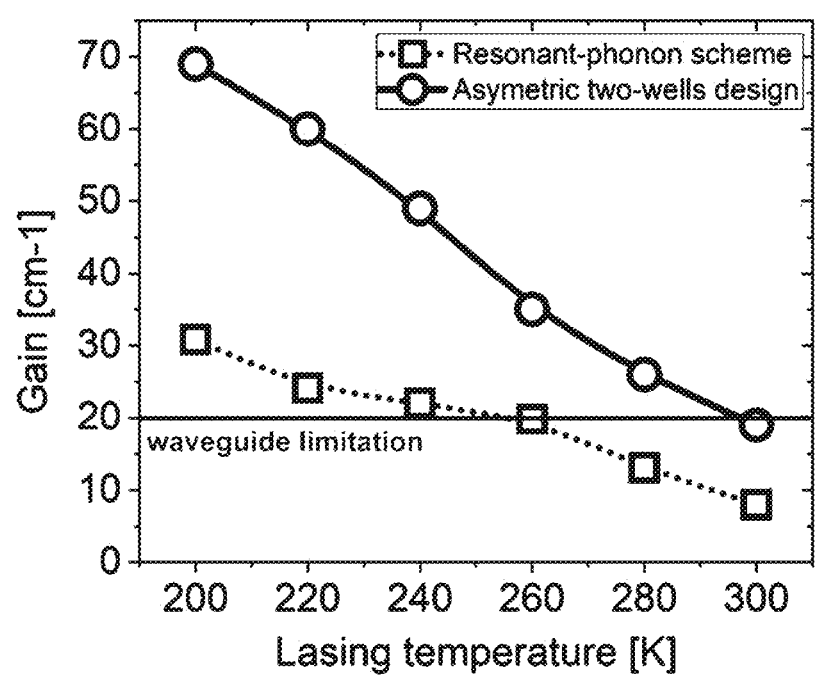
FIG. 10 is a graph illustrating operation temperature dependence of peak optical gain of the THz-QCL element having the conventional RT 3QW structure and the THz-QCL element having the asymmetric 2QW structure, in relation to the first embodiment of the present invention.

Simulation was carried out with the temperature changed, for search for an operable temperature range and prediction of the maximum operating temperature. FIG. 9 is calculated graphs for optical gain spectra of the THz-QCL element having the conventional RT 3QW structure and the THz-QCL element 1000 adopting the asymmetric 2QW structure at 200 K and 260 K, and the horizontal axis represents frequency of the THz waves emitted. Furthermore, FIG. 10 illustrates the operation temperature dependence of the peak optical gain of the THz-QCL element having the conventional RT 3QW structure and the THz-QCL element having the asymmetric 2QW structure. As illustrated in FIG. 9, at 200 K, the optical gain obtained for the conventional RT 3QW structure is 30 cm$^{-1}$, and the optical gain obtained for the asymmetric 2QW structure is 55 cm$^{-1}$, indicating that the optical gain is significantly improved in the THz-QCL element 1000 according to the embodiment. Furthermore, from FIG. 10, at 260 K, the optical gain of 20 cm$^{-1}$ was obtained for the conventional THz-QCL element and the optical gain of 38 cm$^{-1}$ was obtained for the THz-QCL element 1000. In actual QCLs, a certain waveguide loss (typically 20 cm$^{-1}$) needs to be anticipated. When 20 cm$^{-1}$ is assumed for a typical value of such losses in the THz-QCL elements, the upper operation temperature predicted by calculation for the THz-QCL element having the conventional RT 3QW structure is found to be about 260 K. With the THz-QCL element 1000 according to the embodiment, an optical gain that is about the same as that of the THz-QCL element having the conventional RT 3QW structure at 200 K is realized at about 260 K. According to Non-Patent Document 1, a measured value that has been verified for the conventional RT 3QW structure is 199.5 K. This may be compared with the calculated results in FIG. 9 by anticipating the losses in the THz-QCL elements to be, for example, 30 cm$^{-1}$ (not illustrated in FIG. 9 and FIG. 10). If this value is used as the losses, the calculated value for the maximum operating temperature of the THz-QCL element 1000 according to the embodiment may be predicted to be about 260 K. The inventors consider that even when the THz-QCL element 1000 having the asymmetric 2QW structure in FIG. 2B as the potential structure is actually fabricated, that THz-QCL element 1000 is able to be operated at about 260 K at most at a wavelength of 3.5 THz to 4 THz.

2. Second Embodiment: Configuration for Low Frequency Operation

In order to explore further possibility of an asymmetric 2QW structure according to the present invention, its operation in a low frequency THz region (a frequency range equal to or less than 2.0 THz) was also investigated by the NEGF method. A configuration that achieves the highest maximum operating temperature in this frequency range has a quadruple-quantum-well structure, and this highest maximum operating temperature is 160 K (Non-Patent Document 2). Hereinafter, a configuration according to a second embodiment will be described in comparison with a configuration having this quadruple-quantum-well structure (4QW structure). A THz-QCL element having an asymmetric 2QW structure according to the second embodiment also has the structure illustrated in FIG. 1, and only the materials and details, such as the thicknesses of layers, are different from those of the structure illustrated in FIG. 1. Therefore, the same reference signs will continue to be used in the description.

Figure 11A:
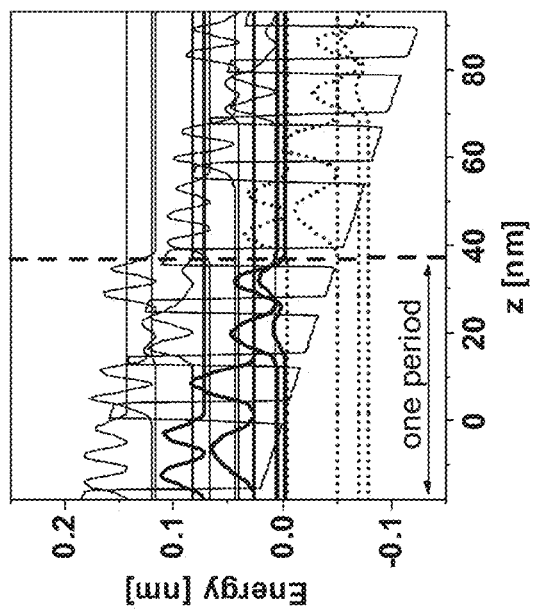
FIGS. 11A and 11B are explanatory diagrams illustrating, in relation to a second embodiment of the present invention, potential structures and subband structures of electrons, for a THz-QCL element having a 4QW structure and a THz-QCL element having an asymmetric 2QW structure according to the second embodiment, for comparison therebetween.
Figure 11B:
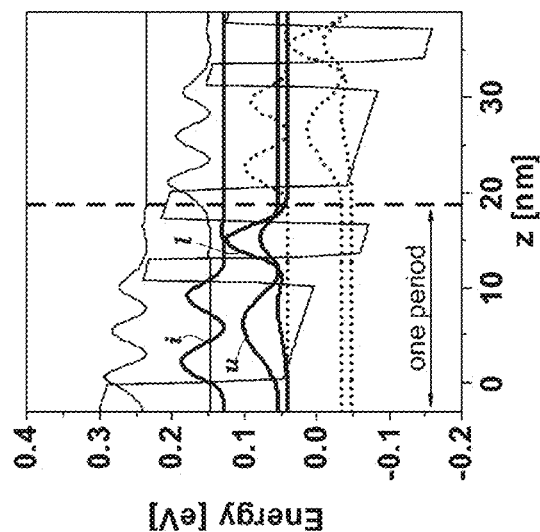

FIGS. 11A and 11B are an explanatory diagram illustrating potential structures and electron level structures, for a THz-QCL element having a 4QW structure and a THz-QCL element 1000 having an asymmetric 2QW structure according to the second embodiment, for comparison therebetween. The THz-QCL element having the 4QW structure has wells formed of GaAs, and barriers formed of $Al_{0.15}Ga_{0.85}As$. In contrast, according to this second embodiment, first well layers are formed of $Al_{0.05}Ga_{0.95}As$, second well layers are formed of GaAs, and barriers are formed of $Al_{0.35}Ga_{0.65}As$. As evident when compared with FIG. 2B, the period is shorter and the amount of modulation of the potential is larger than those according to the first embodiment. These differences are a result of the adjustment of the materials and thicknesses for lasing in the low frequency THz region.

Table 2 represents a typical design example of the THz-QCL element 1000 according to the second embodiment, which operates at 1.5 THz to 1.9 THz, the design example including sizes of the layers, for more specific explanation.

TABLE 2

| Layer | Material | Thickness [nm] |
|---|---|---|
| First barrier layer 10B1 | $Al_{0.3}Ga_{0.7}As$ | 3.8 |
| First well layer 10W1 | $A_{0.08}Ga_{0.92}As$ | 15.0 |
| Second barrier layer 10B2 | $Al_{0.3}Ga_{0.7}As$ | 1.8 |
| Second well layer 10W2 | GaAs | 4.6 |
| Total for a unit structure corresponding to one period | — | 25.2 |

Furthermore, the first well layer 10W1 was designed to be doped at $3\times10$ cm$^{-2}$.

Figure 12B:
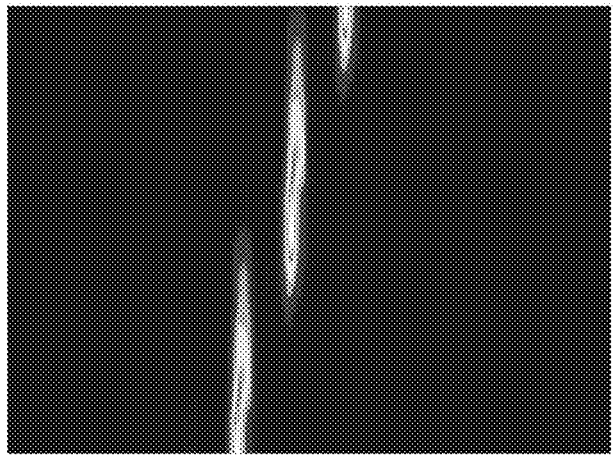
FIGS. 12A and 12B illustrate, in relation to the second embodiment of the present invention, distributions of current density for the THz-QCL element having the conventional 4QW structure as shown in FIG. 12A and the THz-QCL element according to the second embodiment as shown in FIG. 12B, for comparison therebetween.
Figure 12A:
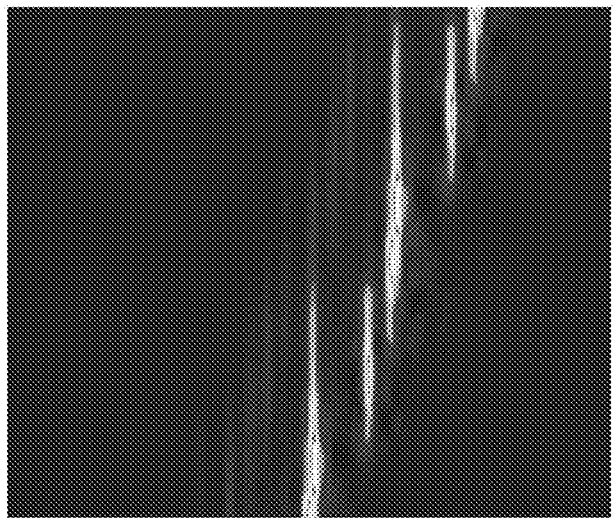
Figure 13:
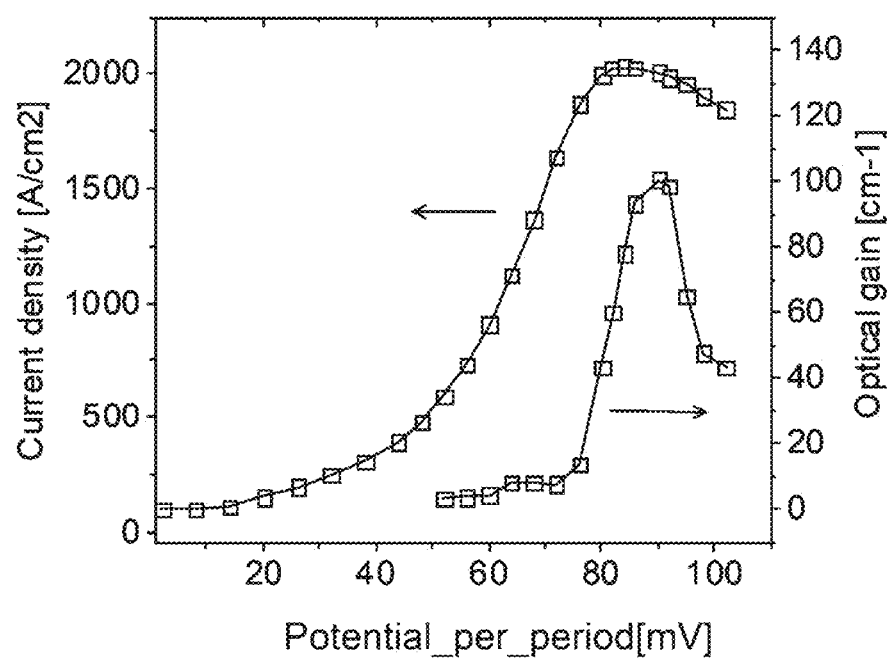
FIG. 13 illustrates operation characteristics (I-V characteristics and optical gain) over the potential difference per unit structure, the operation characteristics having been simulated for the THz-QCL element according to the second embodiment of the present invention.
Figure 14:
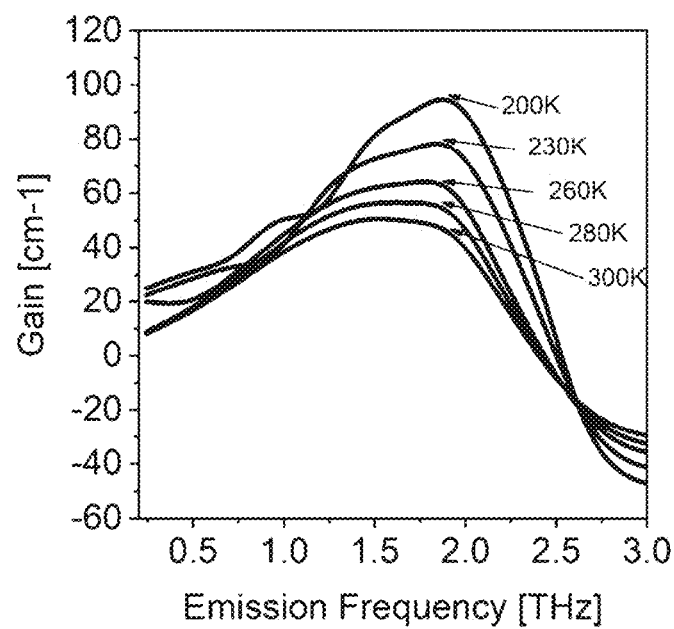
FIG. 14 is a graph illustrating the optical gain over frequency of THz waves found by the NEGF method at different temperatures, according to the second embodiment of the present invention.

FIGS. 12A and 12B illustrate distributions of current density for the THz-QCL element having the 4QW structure (FIG. 12A) and the THz-QCL element 1000 according to the second embodiment (FIG. 12B), for comparison therebetween. FIGS. 12A and 12B illustrate that, as compared to the THz-QCL element having the 4QW structure, which is FIG. 12A, that the THz-QCL element 1000 according to the second embodiment, which is FIG. 12B has very clear flow of current realized therein and no leakage current generated therein. FIG. 13 illustrates operation characteristics (I-V characteristics and optical gain) over the potential difference per unit structure, the operation characteristics having been simulated for the THz-QCL element 1000 according to the second embodiment. As compared to the THz-QCL element 1000 according to the first embodiment illustrated in FIG. 7 and FIG. 8, a comparatively larger bias electric field of about 85 mV/period is needed, but in a low voltage region of 70 mV to 80 mV where high optical gain starts to be realized, no negative resistance is observed. Furthermore, a sufficient optical gain of 100 cm$^{-1}$ is realized at the peak. FIG. 14 illustrates the optical gain over the frequency of THz waves found at each temperature. As illustrated in FIG. 14, sufficient optical gain was obtained over a range having a peak at 1.54 THz at a temperature as high as 300 K (about 27° C.). The inventors consider that these results suggest that by adopting the asymmetric 2QW structure according to the second embodiment, lasing operation of about 1.5 THz to 1.9 THz is achieved at around room temperature.

3. Modified Examples

The above described embodiments of the present invention are not limited to the above described examples, and may be variously modified.

3-1. Application Range of AlGaAs—GaAs-based Materials

Any of the embodiments of the present invention may be implemented by use of a semiconductor superlattice having an AlGaAs—GaAs-based composition. In a typical example of such implementation, where $0\leq y\leq x<z\leq 1$, the materials are selected such that the first well layer 10W1 has a composition, $Al_xGa_{1.0-x}As$, the second well layer 10W2 has a composition, $Al_yGa_{1.0-y}As$, and the barrier layers B1 and B2 have a composition, $Al_zGa_{1.0-z}As$. These compositions are selected such that y<x, in order to make the conduction band potential energy of the second well layer smaller than that of the first well layer and make the second well relatively deeper. The configurations provided in Tables 1 and 2 both satisfy these relations.

3-2. Other Compositions

Any of the embodiments according to the present invention may be realized by use of other materials. For example, any of an InP—InGaAs—InAlAs-based material, an AlInSb—InSb-based material, an AlInSb—InAsSb-based material, a GaAsSb—InGaAs-based material, a GaAs—InGaAs based material, and an AlGaN—GaN—InGaN-based material that does not generate a piezoelectric field and achieves a nonpolar orientation may be adopted. Electron transport involving transition as illustrated in FIG. 3B by fabricating the structure illustrated in FIG. 2B is able to be realized through not only calculation but also experiments, by using conditions for these materials according to the design procedure described based on FIG. 4.

The embodiments of the present invention have been described above specifically. The above embodiments and configuration examples have been described for explanation of the present invention, and the scope of the invention of this patent application should be determined based on what are written in the patent claims. Furthermore, modified examples within the scope of the present invention, the modified example including any other combination of the embodiments, are also included in the scope of the patent claims.

INDUSTRIAL APPLICABILITY

A THz-QCL according to the present invention and having an improved maximum operating temperature may be used in a device that uses a source that generates electromagnetic waves in a THz region.

REFERENCE SIGNS LIST

1000 THz-QCL element
100 QCL structure (semiconductor superlattice structure)
100A Semiconductor superlattice structure
10 Active region
10B, 10B1 to 10B3 Barrier layer
10W, 10W1 to 10W2 Well layer
10U Unit structure
120, 140 Highly doped GaAs layer
160 δ-doped GaAs layer
20, 30 Electrode
30A, 30B Metal layer
40 Receptor
50 Substrate
60 Etch stop layer
u Upper lasing level
l Lower lasing level
i Injection level
2000 Electromagnetic waves

The invention claimed is:

1. A quantum cascade laser element having a semiconductor superlattice structure sandwiched between a pair of electrodes, wherein
the semiconductor superlattice structure has an active region that emits electromagnetic waves of a frequency in a THz region under an external voltage applied through the pair of electrodes for operation,
the active region has plural unit structures, each of which is repeatedly layered over one another,
each of the unit structures has a double quantum well structure formed of a first well layer and a second well layer separated from each other by a barrier layer,
the first well layer and the second well layer have compositions different from each other,
potential energy for electrons in the second well layer when the external voltage is not being applied is less than that in the first well layer, and
a thickness of the second well layer is such that the second well layer has only one thickness direction confinement level with an energy value lower than potentials of two barrier layers sandwiching the second well layer when the external voltage is being applied.

2. The quantum cascade laser element according to claim 1, wherein
under the external voltage, the thickness direction confinement level in the second well layer serves as a lower lasing level, and
under the external voltage, one of at least two thickness direction confinement levels in the first well layer serves as an upper lasing level, the one being lower in energy, and another one of the at least two thickness direction confinement levels serves as an injection level gone through for injection of electrons to the upper lasing level from a lower lasing level determined in an unit structure upstream on a flow of electrons, the another one being higher in energy.

3. The quantum cascade laser element according to claim 2, wherein the first well layer has a thickness such that electrons at the injection level are: subjected to scattering due to LO phonons; and injected to the upper lasing level.

4. The quantum cascade laser element according to claim 1, wherein a material of a semiconductor forming the semiconductor superlattice structure is a nonpolar semiconductor selected from the group consisting of: an AlGaAs—GaAs-based material; an InP—InGaAs—InAlAs-based material; an AlInSb—InSb-based material; an AlInSb—InAsSb-based material; a GaAsSb—InGaAs-based material; a GaAs—InGaAs-based material; and a nonpolar AlGaN—GaN—InGaN-based material.

5. The quantum cascade laser element according to claim 4, wherein
the first well layer is made of a material having a composition of $Al_xGa_{1.0-x}As$,
the second well layer is made of a material having a composition of $Al_yGa_{1.0-y}As$,
the barrier layer is made of a material having a composition of $Al_zGa_{1.0-z}As$, and $0 \leq y < x < z \leq 1$.

6. The quantum cascade laser element according to claim 1, wherein the frequency is any value equal to or greater than 2 THz and equal to or less than 4 THz.

7. The quantum cascade laser element according to claim 1, wherein the frequency is any value equal to or less than 2 THz.

* * * * *